United States Patent
Ward et al.

(10) Patent No.: US 10,655,035 B2
(45) Date of Patent: May 19, 2020

(54) OXIDIZING FLUID FOR THE CHEMICAL-MECHANICAL POLISHING OF CERAMIC MATERIALS

(71) Applicant: SAINT-GOBAIN CERAMICS & PLASTICS, INC., Worcester, MA (US)

(72) Inventors: Douglas Edwin Ward, Santa Ana, CA (US); Jason A. Sherlock, Anaheim, CA (US); Angela Wamina Kwapong, Worcester, MA (US)

(73) Assignee: SAINT-GOBAIN CERAMICS & PLASTICS, INC., Worcester, MA (US)

( * ) Notice: Subject to any disclaimer, the term of this patent is extended or adjusted under 35 U.S.C. 154(b) by 0 days.

(21) Appl. No.: 15/989,150

(22) Filed: May 24, 2018

(65) Prior Publication Data

US 2018/0340095 A1 Nov. 29, 2018

Related U.S. Application Data

(60) Provisional application No. 62/511,199, filed on May 25, 2017.

(51) Int. Cl.
| | |
|---|---|
| G09G 1/04 | (2006.01) |
| C09G 1/04 | (2006.01) |
| H01L 21/02 | (2006.01) |
| H01L 21/306 | (2006.01) |
| C09G 1/06 | (2006.01) |

(52) U.S. Cl.
CPC .......... *C09G 1/04* (2013.01); *H01L 21/02024* (2013.01); *H01L 21/30625* (2013.01); *C09G 1/06* (2013.01)

(58) Field of Classification Search
CPC ... C09G 1/04; C09G 1/00; C09G 1/06; C09K 3/1454; C09K 3/1463; H01L 21/02024; H01L 21/30625
USPC .... 252/79.1, 79.2, 79.3, 79.4; 438/691, 692, 438/693, 694, 745, 750; 216/104, 106
See application file for complete search history.

(56) References Cited

U.S. PATENT DOCUMENTS

| | | | |
|---|---|---|---|
| 6,221,774 B1 | 4/2001 | Malik | |
| 8,162,723 B2 | 4/2012 | Spiro et al. | |
| 9,646,841 B1 * | 5/2017 | Beveridge | ......... H01L 21/30625 |

(Continued)

FOREIGN PATENT DOCUMENTS

| | | |
|---|---|---|
| CN | 102533121 | 7/2012 |
| EP | 1118647 A1 | 7/2001 |

OTHER PUBLICATIONS

International Search Report and Written Opinion dated Aug. 24, 2018 directed to International Application No. PCT/US18/34318; 12 pages.

(Continued)

*Primary Examiner* — Lan Vinh
(74) *Attorney, Agent, or Firm* — Morrison & Foerster LLP (57) ABSTRACT

The present disclosure is directed to a fluid composition that can be used in chemical-mechanical polishing processes of inorganic material. The fluid composition can include at least one oxidizing agent and a multivalent cation component. Using the fluid composition during a chemical-mechanical polishing process can facilitate a relatively defect free material surface after polishing while achieving a suitable material removal rate.

15 Claims, 5 Drawing Sheets

(56) References Cited

U.S. PATENT DOCUMENTS

| | | | |
|---|---|---|---|
| 2005/0045852 A1 | 3/2005 | Ameen et al. | |
| 2009/0008600 A1* | 1/2009 | Jia | B23H 5/08 |
| | | | 252/79.1 |
| 2015/0137319 A1* | 5/2015 | Ishibashi | C30B 23/025 |
| | | | 257/615 |
| 2015/0162213 A1* | 6/2015 | Chen | C23F 1/28 |
| | | | 438/754 |
| 2015/0380263 A1* | 12/2015 | Lan | C09G 1/02 |
| | | | 438/693 |
| 2016/0032186 A1* | 2/2016 | Chen | C23G 1/02 |
| | | | 252/79.3 |
| 2016/0060488 A1* | 3/2016 | Singh | C09K 3/1436 |
| | | | 216/53 |
| 2016/0130475 A1 | 5/2016 | Kojima et al. | |

OTHER PUBLICATIONS

Office Action dated Jul. 17, 2019, directed to Taiwanese Application No. 107117920; 17 pages.

* cited by examiner

OXIDIZING FLUID FOR THE CHEMICAL-MECHANICAL POLISHING OF CERAMIC MATERIALS

REFERENCE TO RELATED APPLICATIONS

This application claims the benefit of U.S. Provisional Application No. 62/511,199, filed May 25, 2017, the entire contents of which are incorporated herein by reference.

FIELD OF THE INVENTION

This disclosure relates to fluids for use in chemical-mechanical polishing applications. More particularly, this disclosure relates to abrasive-free fluids including at least one oxidizing agent and a multivalent cation component for use in chemical-mechanical polishing applications.

BACKGROUND OF THE INVENTION

Ceramic materials are used in a variety of electronic devices, such as diodes, sensors, and power generation devices. These ceramic materials include, but are not limited to, Group 14 materials, such as Silicon Carbide (SiC); Group 13-15 materials, such as gallium nitride; Group 12-16 materials, such as zinc telluride; and group 12-15 materials, such as cadmium arsenide.

To be effective in their use, these ceramic materials must be polished to achieve a relatively defect free surface. One method for achieving such a defect free surface is by chemical mechanical polishing ("CMP"). This method involves chemically altering the surface of the material being polished and/or polishing pad while simultaneously using abrasive particles to remove the chemically altered surface layer. In most CMP methods, the abrasive particles are dispersed in a fluid that also contains the chemicals used to alter the material surface.

SUMMARY OF THE INVENTION

Applicants have discovered a fluid composition that does not contain abrasive particles, but can still achieve a relatively defect free polished surface. Specifically, Applicants have discovered that a fluid comprising at least one oxidizing agent and a multivalent cation component can be used in CMP applications to achieve a relatively defect free ceramic substrate surface after polishing, while achieving a suitable material removal rate. Such an abrasive-free CMP fluid can alter the surface of the material to be polished and can rely on dynamic contact with a polishing pad to impart enough energy to remove the resulting altered surface layer.

Reference to "about" a value or parameter herein includes (and describes) variations that are directed to that value or parameter per se. For example, description referring to "about X" includes description of "X". In addition, reference to phrases "less than", "greater than", "at most", "at least", "less than or equal to", "greater than or equal to", or other similar phrases followed by a string of values or parameters is meant to apply the phrase to each value or parameter in the string of values or parameters. For example, a statement that the polished surface after polishing with the fluid disclosed herein can have an overall surface roughness (Ra) of less than about 10 angstroms (Å), about 8 Å, about 5 Å, or about 3 Å is meant to mean that the polished surface after polishing with the fluid disclosed herein can have an overall surface roughness (Ra) of less than about 10 angstroms (Å), less than about 8 Å, less than about 5 Å, or less than about 3 Å.

The word "substantially" does not exclude "completely." For example, a composition which is "substantially free" from Y may be completely free from Y. The term "substantially free" permits trace or naturally occurring impurities. Accordingly, use of the terms "substantial absence of" and "substantially free of" is not to be construed as absolutely excluding minor amounts of the materials referenced. Where necessary, the word "substantially" may be omitted from the definition of the invention.

The weight percentages listed herein are relative to the total weight of the fluid composition. In addition, unless otherwise stated, these weight percentages are for the fluid at point of use (i.e., when used during polishing).

As used herein, the singular forms "a," "an," and "the" are intended to include the plural forms as well, unless the context clearly indicates otherwise. It is also to be understood that the term "and/or" as used herein refers to and encompasses any and all possible combinations of one or more of the associated listed items. It is further to be understood that the terms "includes, "including," "comprises," and/or "comprising," when used herein, specify the presence of stated features, integers, steps, operations, elements, components, and/or units but do not preclude the presence or addition of one or more other features, integers, steps, operations, elements, components, units, and/or groups thereof.

Additional advantages will be readily apparent to those skilled in the art from the following detailed description. The examples and descriptions herein are to be regarded as illustrative in nature and not restrictive.

BRIEF DESCRIPTION OF THE DRAWINGS

Exemplary embodiments are described with reference to the accompanying figures, in which.

DETAILED DESCRIPTION OF THE INVENTION

Applicants have discovered a fluid composition that can be used in a method for the efficient chemical mechanical polishing of a material such as an inorganic solid. The fluid of the present disclosure can include at least one oxidizing agent and a multivalent cation component. Using the fluids disclosed herein during a CMP process can facilitate a relatively defect free material surface after polishing while achieving a suitable material removal rate.

The fluids described herein can include a solvent. The solvent can dissolve the oxidizing agents and multivalent cation components disclosed herein. In some embodiments, the solvent is water.

The fluid can also contain at least one oxidizing agent. The oxidizing agent can be an oxidizing component added to the fluid or a compound added to the fluid that forms oxidizing components in solution such as a salt, acid, or base. A primary oxidizing agent can have an oxidation potential of about 0.4 V or greater in an aqueous solution. The primary oxidizing agent can alter the surface of the material to be polished thereby making it softer such that contact with a polishing pad can remove the resulting oxidized surface layer. Examples of primary oxidizing agents include, but are not limited to, ions, salts, acids, or bases of permanganate, oxohalides of chlorine, bromine, or iodine (such as iodate and perchlorate), peroxides, persulfates, chromates, $Ce^{+4}$, and $Co^{+3}$, or combinations thereof. In some embodiments, the primary oxidizing agent is a salt or acid of permanganate (such as potassium permanganate, sodium permanganate or permanganic acid) and/or $Ce^{+4}$.

The amount of the primary oxidizing agent in the fluid can be about 0.01-20 wt %, about 0.05-15 wt %, about 0.1-10 wt %, about 0.5-5 wt %, about 1-3 wt %, about 1.5-2.5 wt %, or about 2 wt %. In some embodiments, the amount of the primary oxidizing agent can be less than or equal to about 20 wt %, about 15 wt %, about 10 wt %, about 5 wt %, about 3 wt %, or about 2 wt %. In some embodiments, the amount of the primary oxidizing agent can be greater than or equal to about 0.01 wt %, about 0.1 wt %, about 0.5 wt %, about 1 wt %, about 1.5 wt %, or about 2 wt %.

The fluids disclosed herein can be prepared as concentrates and diluted with water or other suitable solvent. Accordingly, amount of the primary oxidizing agent in the concentrated fluid can be about 0.02-40 wt %, about 0.1-30 wt %, about 0.2-20 wt %, about 1-10 wt %, about 2-6 wt %, about 3-5 wt %, or about 4 wt %. In some embodiments, the amount of the primary oxidizing agent in the concentrated fluid can be less than or equal to about 40 wt %, about 30 wt %, about 20 wt %, about 10 wt %, about 5 wt %, or about 4 wt %. In some embodiments, the amount of the primary oxidizing agent in the concentrated fluid can be greater than or equal to about 0.02 wt %, about 0.2 wt %, about 1 wt %, about 2 wt %, about 3 wt %, or about 4 wt %. In some embodiments, the concentrated fluid can be diluted with a 50:50 dilution, or other suitable ratio, of additional solvent.

The fluid can also contain a multivalent cation component. The multivalent cation component can alter the surface charge or zeta potential of most surfaces in contact with the fluid during the polishing process. These surfaces can include the material being polished, the polishing pad, and any particles present either intentionally present or generated by the polishing process generally known as swarf. Swarf can be generated from the material being polished, the polishing pad, and/or the polishing machine.

The multivalent cation component can add a higher positive charge to the surface being polished and/or the polishing pad. In addition, any stray particle that presents itself during polishing can also be highly positively charged. As such, a repulsive force between the positively charged stray particle and the positively charged polishing surface/pad can limit or make it much more difficult for that particle to scratch the surface being polished.

The multivalent cation component can be a multivalent cation added to the fluid or a compound added to the fluid that forms at least a multivalent cation in solution such as a salt, acid, or base. In addition, the multivalent cation can be a free acting multivalent ion or can be part of a complex formed with other components of the fluid such as a chelating agent. The multivalent cation components can include any element of the periodic table that is stable in the fluid. Using the IUPAC format numbers for the periodic table, examples of multivalent cation components include, but are not limited to, any Group 2 through Group 16 ions, salts, acids, or bases; any Lanthanide series ions, salts, acids, or bases; or combinations thereof. Specific multivalent cation components include, but are not limited to $Mg^{+2}$, $Ba^{+2}$, $Ag^{+2}$, $Ni^{+2}$, $Zn^{+2}$, $Al^{+3}$, $Fe^{+3}$, $Cr^{+3}$, $Co^{+3}$, $Ce^{+4}$, $Zr^{+4}$, $Mn^{+2}$, $Cu^{+2}$, $Cu^{+3}$, and $Sn^{+4}$ or salts, acids, or bases of the previously mentioned ions. In some embodiments, the multivalent cation component can be an ion, salt, acid, or base of $Al^{+3}$ such as aluminum nitrate. The multivalent cation component added to the fluid can also form a corresponding anionic component in solution. The corresponding anionic components can include any negatively charged ion that is stable and soluble in an aqueous solution with the oxidizing agents. Preferably, the corresponding anionic components of the multivalent cation components can have relatively low charge density and/or be typically monovalent. Examples of corresponding anionic components of the multivalent cation components include, but are not limited to, nitrate, tetrafluoroborate, fluorosulfate, hexafluorophosphate, fluorophosphonate, selenate, sulfate, phosphate, chloride, fluoride, and/or sulfamate.

Salts, acids, or bases of multivalent metals can unexpectedly form high oxidizing, low pH solutions even at low concentrations. For example, in solution, $Fe(NO_3)_3$ does not form $[Fe(H_2O)_6]_3 + 3NO_3-$. Instead it hydrolyses water as in the following equation: $[Fe(H_2O)_6]^{3+} + H_2O \leftarrow \rightarrow [Fe(H_2O)_5(OH)]^{2+} + H_3O^+$. In other words, nitric acid can be formed, which at low pH is highly oxidizing. Accordingly, dissolving salts of multivalent metals in water (or an organic solvent, trace water is sufficient) can be enough to create a strongly oxidizing low pH solution. The following Table 1 illustrates some examples for the first hydrolysis of the equation above at low concentration, 0.1M (the actual pH will be much lower due to the $2^{nd}$, $3^{rd}$, ... hydrolyses:

TABLE 1

| Ion | ph of 0.1 M solution in water |
|---|---|
| $Sr^{2+}$ | 7.0 |
| $Ag^+$ | 6.3 |
| $Mn^{2+}$ | 5.8 |
| $Zn^{2+}$ | 5.3 |
| Rare Earth, $Cu^{2+}$ | 4.5 |
| $Pb^{2+}$ | 3.7 |
| $Al^{3+}$ | 2.9 |
| $Fe^{3+}$ | 2.0 |
| $Cr^{3+}$ | 2.0 |
| $Bi^{3+}$ | 1.4 |

The amount of the multivalent cation component in the fluid can be about 0.01-15 wt %, about 0.01-12 wt %, about 0.01-10 wt %, about 0.01-5 wt %, about 0.01-3 wt %, about 0.01-1 wt %, about 0.05-0.75 wt %, about 0.1-0.5 wt %, about 0.1-0.3 wt %, about 0.1-0.2 wt %, or about 0.125 wt %. In some embodiments, the amount of the multivalent cation component in the fluid can be less than or equal to about 15 wt %, about 12 wt %, about 10 wt %, about 8 wt %, about 5 wt %, about 3 wt %, about 2 wt %, about 1 wt %, about 0.5 wt %, about 0.25 wt %, or about 0.125 wt %. In some embodiments, the amount of the multivalent cation component in the fluid can be greater than or equal to about 0.01 wt %, about 0.05 wt %, about 0.1 wt %, about 0.125 wt %, about 0.25 wt %, about 0.5 wt %, about 0.75 wt %, or about 1 wt %.

As previous discussed, the fluids disclosed herein can be prepared as concentrates and diluted with water or other suitable solvent. Accordingly, the amount of the multivalent cation component in the concentrated fluid can be about 0.2-30 wt %, about 0.02-25 wt %, about 0.02-20 wt %, about 0.02-10 wt %, about 0.02-6 wt %, about 0.02-2 wt %, about 0.1-1.5 wt %, about 0.2-1 wt %, about 0.2-0.6 wt %, about 0.2-0.3 wt %, or about 0.25 wt %. In some embodiments, the amount of the multivalent cation component in the concentrated fluid can be less than or equal to about 30 wt %, about 25 wt %, about 20 wt %, about 15 wt %, about 10 wt %, about 5 wt %, about 4 wt %, about 2 wt %, about 1 wt %, about 0.5 wt %, or about 0.25 wt %. In some embodiments, the amount of the multivalent cation component in the concentrated fluid can be greater than or equal to about 0.02 wt %, about 0.1 wt %, about 0.2 wt %, about 0.25 wt %, about 0.5 wt %, about 1 wt %, about 1.5 wt %, or about 2 wt %. In some embodiments, the concentrated fluid can be diluted with a 50:50 dilution, or other suitable ratio, of additional solvent.

In some embodiments, the fluid can also include a secondary oxidizing agent. The secondary oxidizing agent can also be an oxidizing component added to the fluid or a compound added to the fluid that forms oxidizing components in solution such as a salt, acid, or base. In some embodiments, the secondary oxidizing agent has a higher oxidation potential than the primary oxidizing agent. The combination of the two oxidizing agents can provide synergistic oxidation effects. In addition, a secondary oxidizer with a higher oxidative potential than the primary oxidizer can stabilize the primary oxidizer through regeneration or sacrificial mechanisms. For example, the secondary oxidizer can be included to maintain the primary oxidizer in its preferred oxidizing state. Examples of secondary oxidizing agents include, but are not limited to, ions, salts, acids, or bases of persulfates, ferrates, oxohalides of chlorine, bromine, or iodine, strong organoperoxides, chromates, $Ce^{+4}$, and $Co^{+3}$, or combinations thereof. In some embodiments, the secondary oxidizing agent is a salt or acid of persulfate such as sodium or potassium persulfate. In some embodiments, more than two oxidizing agents can be utilized in the fluid to provide additional synergistic effects.

The amount of the secondary oxidizing agent in the fluid can be lower than the amount of primary oxidizing agent in the fluid. For example, the amount of the secondary oxidizing agent in the fluid can be about 0.01-20 wt %, 0.01-15 wt %, about 0.01-12 wt %, about 0.01-10 wt %, about 0.01-5 wt %, about 0.01-3 wt %, about 0.01-1 wt %, about 0.05-0.75 wt %, about 0.1-0.5 wt %, about 0.1-0.3 wt %, about 0.1-0.2 wt %, or about 0.125 wt %. In some embodiments, the amount of the secondary oxidizing agent in the fluid can be less than or equal to about 20 wt %, about 15 wt %, about 12 wt %, about 10 wt %, about 8 wt %, about 5 wt %, about 3 wt %, about 2 wt %, about 1 wt %, about 0.5 wt %, about 0.25 wt %, or about 0.125 wt %. In some embodiments, the amount of the secondary oxidizing agent in the fluid can be greater than or equal to about 0.01 wt %, about 0.05 wt %, about 0.1 wt %, about 0.125 wt %, about 0.25 wt %, about 0.5 wt %, about 0.75 wt %, or about 1 wt %.

As previous discussed, the fluids disclosed herein can be prepared as concentrates and diluted with water or other suitable solvent. Accordingly, the amount of the secondary oxidizing agent in the concentrated fluid can be about 0.1-40 wt %, about 0.2-30 wt %, about 0.02-25 wt %, about 0.02-20 wt %, about 0.02-10 wt %, about 0.02-6 wt %, about 0.02-2 wt %, about 0.1-1.5 wt %, about 0.2-1 wt %, about 0.2-0.6 wt %, about 0.2-0.3 wt %, or about 0.25 wt %. In some embodiments, the amount of the secondary oxidizing agent in the concentrated fluid can be less than or equal to about 40 wt %, about 30 wt %, about 25 wt %, about 20 wt %, about 15 wt %, about 10 wt %, about 5 wt %, about 4 wt %, about 2 wt %, about 1 wt %, about 0.5 wt %, or about 0.25 wt %. In some embodiments, the amount of the secondary oxidizing agent in the concentrated fluid can be greater than or equal to about 0.02 wt %, about 0.1 wt %, about 0.2 wt %, about 0.25 wt %, about 0.5 wt %, about 1 wt %, about 1.5 wt %, or about 2 wt %. In some embodiments, the concentrated fluid can be diluted with a 50:50 dilution, or other suitable ratio, of additional solvent.

In some embodiments, the fluids described herein can have an oxidative normality of about 0.2-2 or about 0.6445-1.309. The oxidative normality can be measured by direct reduction-oxidation titration with ferrous ammonium sulfate, or other suitable analytical methodology such as thermometric titration.

The fluids disclosed herein can also include a variety of other additives. These additives should be stable in an aqueous solution with oxidizing agent(s) and multivalent cation components. For example, the fluids can include pH modifiers, chelating agents, rheology modifiers, surfactants, and/or abrasive particles all added to the fluid. Preferably, the pH modifier when dissociated can have a conjugate acid or base of relatively low charge density and/or can be typically monovalent. Examples of pH modifiers include, but are not limited to, hydrofluoric acid, nitric acid, sulfamic acid, fluorosulfuric acid, fluorophosphonic acid, tetrafluoroboric acid, hexafluorophosphoric acid, fluorosilicic acid, selenic acid, sulfuric acid, phosphoric acid, ammonium hydroxide, sodium hydroxide, potassium hydroxide, or combinations thereof. In some embodiments, the pH modifier is nitric acid. In some embodiments, the pH of the fluid can be less than about 7, less than about 4, less than about 3, less than about 2, less than about 1, about 1-3, or about 2 as measured by a Ross combination pH probe. The amount of pH modifiers in the fluid can be less than about 5 wt %, about 3 wt %, about 2 wt %, about 1 wt %, or about 0.5 wt %.

Examples of chelating agents include, but are not limited to, phosphonates, polyphosphonates, etidronic acid, or combinations thereof. In some embodiments, the chelating agent is etidronic acid. The amount of chelating agent in the fluid can be about less than about 5 wt %, about 4 wt %, about 3 wt %, about 2 wt %, or about 1 wt %.

Examples of rheology modifiers include, but are not limited to, clays such as smectite, kaolin, bentonite, and kaolinite, or combinations thereof. The amount of rheology modifiers in the fluid can be about less than about 5 wt %, about 4 wt %, about 3 wt %, about 2 wt %, about 1.5 wt %, or about 1 wt %.

Examples of surfactants include, but are not limited to, fluorosulfonate surfactants such as Capstone FS-10. In some embodiments, the surface tension of the fluid is less than about 60 dynes/cm, about 50 dynes/cm, about 45 dynes/cm, about 40 dynes/cm, or about 35 dynes/cm at 20° C. using a De Nouy ring tensiometer. The amount of surfactants in the fluid can be less than about 5 wt %, about 3 wt %, about 2 wt %, about 1 wt %, or about 0.5 wt %.

Examples of abrasive particles include, but are not limited to, alumina, zirconia, ceria, silica, and diamond, or combinations thereof. For example, the abrasive particles can be 100 nm average size polycrystalline alumina from Saint-Gobain. The amount of abrasive particles in the fluid can be less than about 20 wt %, about 15 wt %, about 10 wt %, about 7.5 wt %, about 6 wt %, about 5 wt %, about 4 wt %, about 3 wt. %, about 2 wt. %, or about 1.5 wt. %. In some embodiments, the amount of abrasive particles in the fluid can be about 0.1-5 wt. %, about 0.1-3 wt. %, about 0.5-2 wt. %, about 0.5-1.5 wt. %, about 0.75-1.25 wt. %, or about 1 wt. %. In some embodiments, the fluid is substantially free of abrasive particles. In some embodiments, the amount of abrasive particles in the fluid can be less than about 1 wt %, about 0.5 wt %, about 0.1 wt %, about 0.05 wt. %, about 0.01 wt. %, or about 0.001 wt. %. In some embodiments, if the fluid includes abrasive particles the amount of primary oxidizing agent, multivalent cation component, and secondary oxidizing agent can be doubled compared to the amounts disclosed above for such components.

In some embodiments, the inorganic solid to be polished can be a material comprised of elements in groups 12, 13, 14, 15, and 16 of the periodic table according to IUPAC format numbers. Examples of these materials include, but are not limited to, silicon carbide, gallium nitride, gallium arsenide, aluminum nitride, indium phosphide, cadmium telluride, zinc telluride, zinc selenide, cadmium arsenide, and/or bismuth telluride. The material to be polished can also be either a single group 14 element of the periodic table such as carbon in the form of diamond, silicon, or germanium; or a single group 16 element such as selenium or tellurium.

The CMP process can use a polishing pad that can include textile, polyurethane, polyethylene, polyester, polyvinylchloride, polycarbonate, polyamide, polyacrylate, polystyrene, polypropylene, nylon, and/or other polymeric material. The pad can vary in density and roughness and may be impregnated with abrasive particles. Typically, the pad can be circular and mounted on a ring or plate that rotates about its center axis which is perpendicular to the surface of the material being polished. The fluid disclosed herein can be applied to the pad and/or to the surface of the material being polished before and/or during polishing.

The polished surface should have negligible scratches and pits. In some embodiments, the polished surface after polishing with the fluid disclosed herein can have an overall surface roughness (Ra) of less than about 10 angstroms (Å), about 8 Å, about 5 Å, about 3 Å, about 2.5 Å, about 2 Å, or about 1.75 Å. The overall surface roughness (Ra) can be measured by Zygo New view 8300 microscope or by atomic force microscope Bruker Dimension Icon. In addition, the material removal rate of polishing using the fluid disclosed herein can be greater than about 0.1 microns/hr, about 0.2 microns/hr, about 0.3 microns/hr, about 0.5 microns/hr, about 0.75 microns/hr, about 1 micron/hr, about 1.5 microns/hr, about 1.75 microns/hr, about 2 microns/hr, about 2.5 microns/hr, or about 3 microns/hr. In some embodiments, the material removal rate of polishing using the fluid disclosed herein can be about 0.1-4 microns/hr, about 0.2-3 microns/hr, about 0.5-3 microns/hr, or about 1-3 microns/hr. The material removal rate of polishing can be measured by gravimetric analysis. Furthermore, the scratch count after polishing with the fluid disclosed herein can be less than about 500, about 400, about 300, about 200, about 150, or about 100. The scratch count can be measured by LaserTec SICA6X instrument or Candella CS-20 instrument. Furthermore, the total thickness variation for a wafer polished using the fluid disclosed herein can be about −1 to 1, about −0.75 to 0.75, about −0.5 to 0.5, about −0.25 to 0.25, about −0.2 to 0.2, or about −0.1 to 0.1. The total thickness variation can be measured by Tropel UltraSort or by Proforma 300i instruments.

The disclosed fluid does not require an abrasive to be effective, but an abrasive may be added provided it does not produce excessive surface defectivity or reduce removal rate below acceptable levels.

EXAMPLES

Unless otherwise stated, all percentages of the examples are by weight of the total fluid composition.

Example 1

A fluid was prepared containing 2% potassium permanganate (primary oxidizer), 0.125% aluminum nitrate (multivalent cation component), and 0.125% potassium persulfate (secondary oxidizer). The pH of the fluid was adjusted from 4.0 to 2.0 using 1N nitric acid (~0.675 wt %).

Example 2

A fluid was prepared containing 2% potassium permanganate (primary oxidizer), 0.125% ceric ammonium nitrate (combination multivalent cation component and secondary oxidizer). The pH of the fluid was adjusted from 4.15 to 2.0 using 1N nitric acid (~0.15 wt %).

Example 3

A fluid was prepared containing 2% potassium permanganate (primary oxidizer) and 0.125% potassium persulfate (secondary oxidizer). Additionally, 0.075% etidronic acid (chelant and anion) and 0.0135% fluorosulfonate surfactant (Capstone FS-10) were added. The pH of the fluid was adjusted from 5.9 to 2.0 using 1N nitric acid (~0.86 wt %). In addition, the surface tension of this fluid was measured to be 38.3 dynes/cm at 20° C. using a De Nouy ring tensiometer.

These examples can be tested for various parameters. A machine for polishing can be a Strasbaugh 6CA polisher and the substrate to be polished can be silicon carbide. Polishing pads used can be Cabot Epic D200, Poval Zan 100, or Fujibo 13M. Removal rates can be specific to each side of the wafer as silicon carbon demonstrates a distinctive silicon face and carbon face in its crystalline structure which polishes at different rates. In addition, both n-type and semi-insulated wafers can be tested.

Experimental Data

Figure 1:
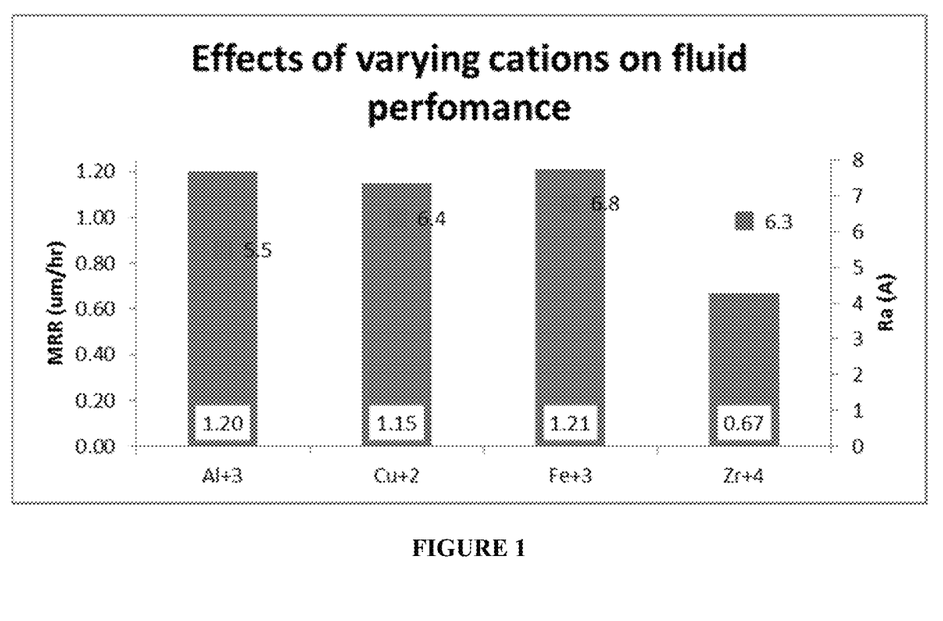
FIG. 1 is a chart displaying the results of a test showing the effects of various cations on fluid polishing performance.

Effect of Metal Cation:

Various cations were tested to determine if they improve the material removal rates (measured by gravimetric analysis) and surface finish (measured as Ra in units of angstroms on silicon carbide (SiC) wafers by a Zygo New view 8300 microscope) when added to a 2.00 wt. % potassium permanganate aqueous solution (130.4 mM) with 0.125 wt. % potassium persulfate (4.76 mM) as a secondary oxidizer. The following cations were tested $Al^{+3}$, $Cu^{+2}$, $Fe^{+3}$ and $Zr^{+4}$. Aluminum, copper, and iron were tested as nitrate salts and zirconia was tested as a sulfate salt (due to the nitrate salt of zirconia being unavailable). After adding the appropriate salts, each solution was adjusted to a pH of 2.10 using nitric acid. These salt solutions were tested at equivalent molar ratios (3.43 mM of the cation itself in the solution) on 4 inch SiC wafers with a Strasbaugh 6CA polisher, using the following machine parameters:

| Pad | Polyeurathane |
|---|---|
| Platen rotational speed | 50 rpm |
| Pressure | 4 psi |
| Fluid flow rate | 40 ml/min |

The results of these tests are shown in FIG. 1. As seen in FIG. 1, the +3 oxidation state ions ($Fe^{+3}$ and $Al^{+3}$) produced superior MRR to the other two ions. In addition, $Al^{+3}$ gave a better Ra compared to the other ions tested as well as a lower scratch count when the wafers were analyzed with a LaserTec SICA6X instrument.

Figure 2:
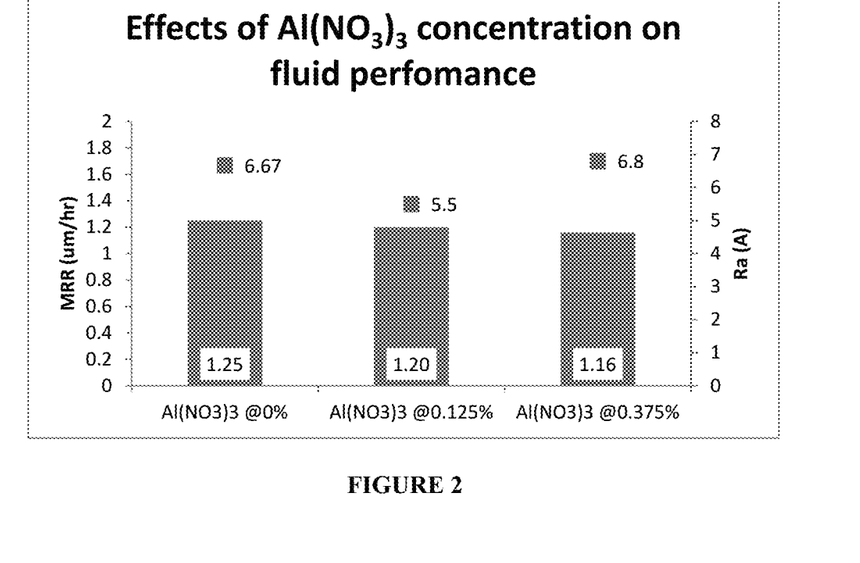
FIG. 2 is a chart displaying the results of a test showing the effects of $Al(NO_3)_3$ concentration on fluid polishing performance.

Optimizing $Al^{+3}$ Concentration:

Since $Al^{+3}$ was identified as an ion which imparted superior MRR and Ra vs the other ions tested above, a second test was performed to determine the best use concentration for this ion. A test was carried out adding aluminum nitrate nonohydrate at concentrations of 0%, 0.125 wt. % and 0.375 wt. % (0, 3.43 and 6.86 mM respectively, of the cation itself in solution) to a 2.00 wt. % potassium permanganate solution (130.4 mM) with 0.125 wt. % potassium persulfate (4.76 mM) as a secondary oxidizer. After adding the aluminum nitrate, each solution was adjusted to a pH of 2.1 using nitric acid. These salt solutions were tested on 4 inch SiC wafers with a Strasbaugh 6CA polisher, using the same machine parameters as the previous test:

| Pad | polyeurathane |
|---|---|
| Platen rotational speed | 50 rpm |
| Pressure | 4 psi |
| Fluid flow rate | 40 ml/min |

The results of these tests are shown in FIG. 2. As shown in FIG. 2, the presence of aluminum nitrate reduces the MRR. However, at concentrations below 0.375 wt. %, the presence of the aluminum nitrate also reduced surface Ra.

Figure 3:
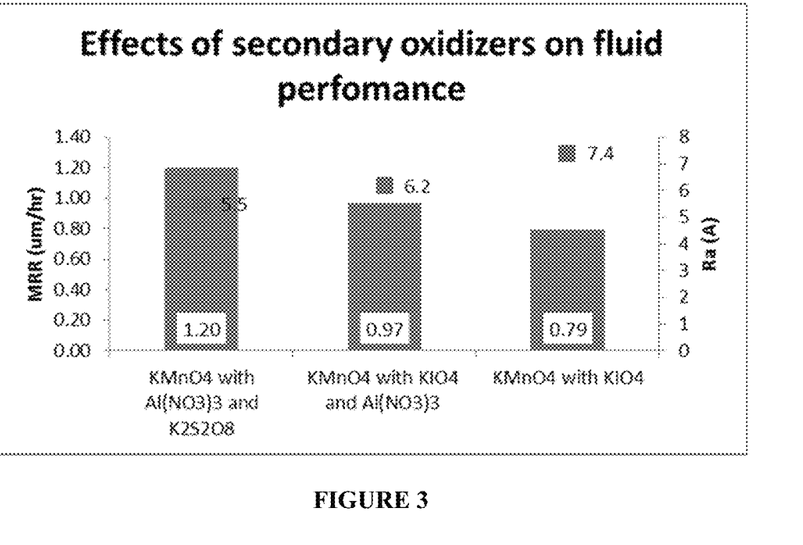
FIG. 3 is a chart displaying the results of a testing showing the effects of secondary oxidizers on fluid polishing performance.

Evaluation of Secondary Oxidizers:

The effects of changing the secondary oxidizer from potassium persulfate ($K_2SO_8$) to potassium periodate ($KIO_4$) at 3.43 mM concentration were evaluated using a 2.00 wt. % potassium permanganate solution (130.4 mM). Each secondary oxidizer was added to the potassium permanganate solution at a concentration of 0.125 wt. % (4.76 mM). After adding the appropriate oxidizers, each solution was adjusted to a pH of 2.1 using nitric acid. These tests were run under the same conditions as the previous tests, 4 inch SiC wafers with a Strasbaugh 6CA polisher, using the following machine parameters:

| Pad | Polyeurathane |
|---|---|
| Platen rotational speed | 50 rpm |
| Pressure | 4 psi |
| Fluid flow rate | 40 ml/min |

The results of these tests are shown in FIG. 3. As shown in FIG. 3, the potassium periodate both decreased MRR and increased surface roughness (Ra) compared to an equivalent quantity of potassium persulfate. Removing the aluminum nitrate exacerbated these effects, giving further evidence that aluminum nitrate has a positive effect on surface roughness (i.e., lower Ra).

Figure 4:
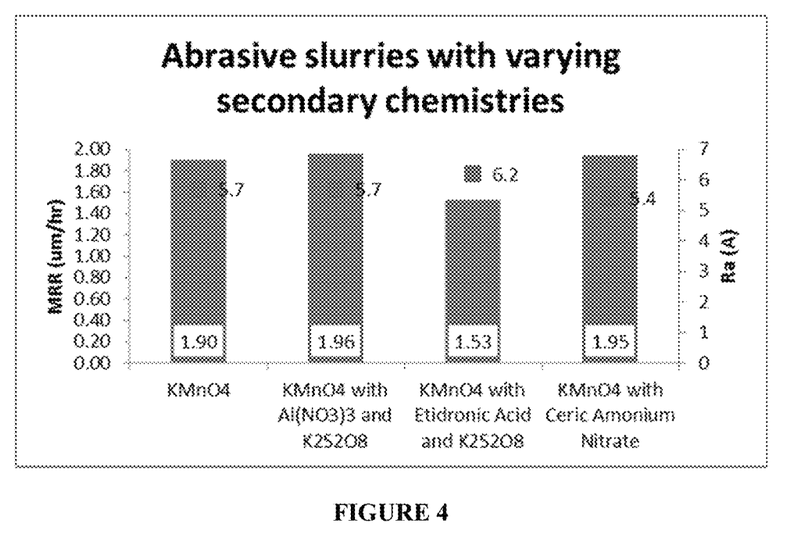
FIG. 4 is a chart displaying the results of a testing showing the effects of abrasive slurries with varying secondary chemistries.

Polishing with the Addition of Abrasives:

By adding abrasives (100 nm average size polycrystalline alumina, from Saint-Gobain at 1 wt. %) to a 4% potassium permanganate solution (261.7 mM) and using the same machine parameters, the effects of various additives were studied. The materials tested were aluminum nitrate nonohydrate at 0.25 wt. % (6.89 mM of the cation itself in the solution) with potassium persulfate at 0.25 wt. % (9.56 mM), etidronic acid at 0.3 wt. % (15.06 mM) and ceric ammonium nitrate at 0.37 wt. % (6.98 mM) vs 1 wt. % of the alumina abrasive in 4 wt. % (261.7 mM) potassium permanganate solution. After adding the abrasive and any additional chemistry, each solution was adjusted to a pH of 2.1 using nitric acid. These tests were run under the same conditions as the previous tests, 4 inch SiC wafers with a Strasbaugh 6CA polisher, using the following machine parameters:

| Pad | Polyeurathene |
|---|---|
| Platen rotational speed | 50 rpm |
| Pressure | 4 psi |
| Fiuid flow rate | 40 ml/min |

The results of these tests are shown in FIG. 4. As shown in FIG. 4, the addition of alumina abrasive resulted in small variation in performance between these chemistries and only KMnO4 using the current machine settings. The exceptions being decreased MRR and higher Ra for etidronic acid and a decrease in Ra from the $Ce^{+4}$. The similar values produced give evidence that the polishing mechanism at these settings has a high mechanical contribution which may be masking the effects of the chemistry changes.

Figure 5:
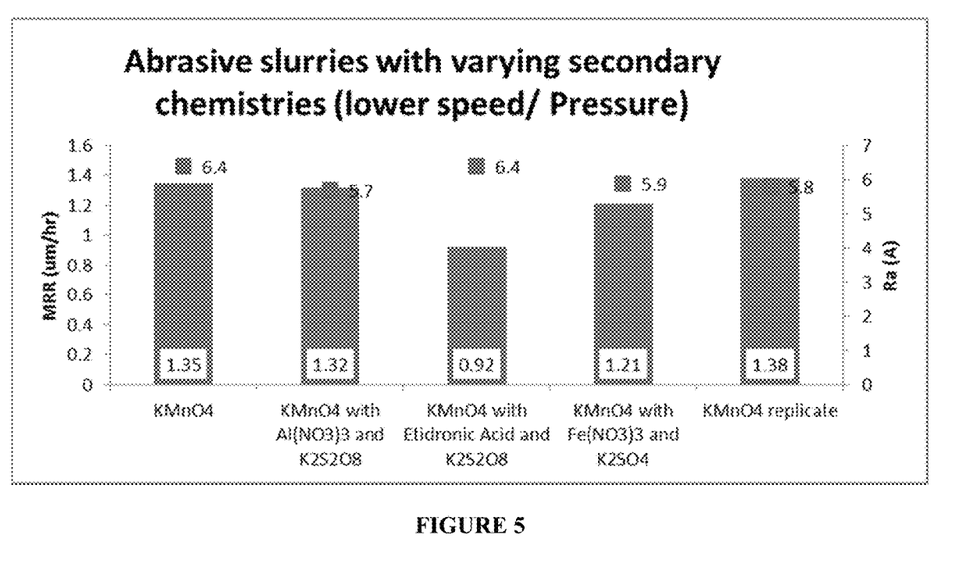
FIG. 5 is a chart displaying the results of a testing showing the effects of abrasive slurries with varying secondary chemistries at lower speed/pressure.

This test was repeated at lower pressure and speed to see the effect of changing these parameters. At less mechanically aggressive machine settings, without being bound by any theory, Applicants think that the chemical effects of polishing will be more apparent. Also, in this lower pressure and speed test, $Fe^{+3}$ at 6.86 mM concentration was used in place of ceric ammonium nitrate as it had shown a positive effect in earlier testing.

| Pad | Polyeurathane |
|---|---|
| Platen rotational speed | 40 rpm |
| Pressure | 3.3 psi |
| fluid flow rate | 40 ml/min |

The results of these tests are shown in FIG. 5. At these lower speed/pressure settings there was a greater differentiation in results between these chemistries. The etidronic acid, which at higher speed/pressure settings demonstrated improved MRR and similar Ra to KMnO4 alone, still gave similar Ra values, but now demonstrated a large decrease in MRR. $Fe^{+3}$ demonstrated a minor decrease in MRR with a similar Ra value to the KMnO4 control. $Al^{+3}$ had the lowest Ra value, with a minor loss in MRR.

The addition of an abrasive particle increases the mechanical effect of the polishing mechanism. This is more pronounced as pressure and speed are increased.

For both abrasive free and abrasive containing polishing fluids, the polishing results improved in aspects of MRR, Ra, and scratch count results when multi-valent cations were incorporated into the fluid vs. fluids using monovalent salts. In these fluids, the presence of trivalent cations demonstrated the highest positive effect on the MRR and Ra. Within this effect, $Al^{+3}$ had a larger contribution to both Ra and MRR than $Fe^{+3}$. There also appears to be an optimal concentration for $Al^{+3}$ ions under these conditions.

The overall trend for positive polishing contribution follows the trend: $M^{+1}<M^{+2}<M^{+3}$; where M is a metal cation. There was a resultant negative effect for the +4 ion which was tested. However, because the $Zr^{+4}$ ion exists as an oxynitrate, the results of the zirconia may not have been representative of an ion being in a true +4 oxidation state.

EMBODIMENTS

The following embodiments provide various non-limiting embodiments described herein.

Embodiment 1

A fluid composition for chemical-mechanical polishing, comprising: a solvent; an oxidizing agent having an oxidation potential of 0.4 V or greater; and a multivalent cation component.

Embodiment 2

The fluid composition of embodiment 1, wherein the multivalent cation component comprises $Mn^{+2}$, $Cu^{+2}$, $Mg^{+2}$, $Ba^{+2}$, $Ag^{+2}$, Ni $Zn^{+2}$, $Al^{+3}$, $Fe^{+3}$, $Cr^{+3}$, $Co^{+3}$, $Ce^{+4}$, $Zr^{+4}$, or $Sn^{+4}$.

Embodiment 3

The fluid composition of any of embodiments 1-2, wherein the multivalent cation component is a salt, acid, or base.

Embodiment 4

The fluid composition of any of embodiments 1-3, wherein the multivalent cation component comprises an anionic component comprising a nitrate, tetrafluoroborate, fluorosulfate, hexafluorophosphate, fluorophosphonate, selenate, sulfate, phosphate, chloride, fluoride, or sulfamate.

Embodiment 5

The fluid composition of any of embodiments 1-4, wherein the multivalent cation component comprises aluminum nitrate.

Embodiment 6

The fluid composition of any of embodiments 1-5, wherein the amount of the multivalent cation component in the fluid composition is 0.01-15 wt %.

Embodiment 7

The fluid composition of any of embodiments 1-6, wherein the amount of the multivalent cation component in the fluid composition is 0.05-0.75 wt %.

Embodiment 8

The fluid composition of any of embodiments 1-7, wherein the multivalent cation component is a free acting ion or part of a complex.

Embodiment 9

The fluid composition of any of embodiments 1-8, wherein the oxidizing agent is an ion, salt, acid, or base of permanganate, oxohalide of chlorine, bromine, or iodine, peroxide, persulfate, chromate, $Ce^{+4}$, and $Co^{+3}$.

Embodiment 10

The fluid composition of any of embodiments 1-9, wherein the oxidizing agent comprises an ion, salt, acid, or base of permanganate or $Ce^{+4}$.

Embodiment 11

The fluid composition of any of embodiments 1-10, wherein the oxidizing agent comprises sodium permanganate or potassium permanganate.

Embodiment 12

The fluid composition of any of embodiments 1-11, wherein the amount of the oxidizing agent in the fluid composition is 0.1-20 wt %.

Embodiment 13

The fluid composition of any of embodiments 1-12, wherein the amount of the oxidizing agent in the fluid composition is 0.5-5 wt %.

Embodiment 14

The fluid composition of any of embodiments 1-13, further comprising a second oxidizing agent having a higher oxidation potential than the first oxidizing agent.

Embodiment 15

The fluid composition of embodiment 14, wherein the second oxidizing agent comprises an ion, salt, acid, or base of persulfate, ferrates, oxohalide of chlorine, bromine, or iodine, organoperoxide, chromate, $Ce^{+4}$, and $Co^{+3}$.

Embodiment 16

The fluid composition of any of embodiments 14-15, wherein the second oxidizing agent comprises sodium persulfate or potassium persulfate.

Embodiment 17

The fluid composition of any of embodiments 14-16, wherein an amount of the second oxidizing agent in the fluid composition is 0.01-20 wt %.

Embodiment 18

The fluid composition of any of embodiments 14-17, wherein an amount of the second oxidizing agent in the fluid composition is 0.1-0.5 wt %.

Embodiment 19

The fluid composition of any of embodiments 1-18, wherein the fluid composition has an oxidative normality of 0.2-2.

Embodiment 20

The fluid composition of any of embodiments 1-19, further comprising a pH modifier comprising hydrochloric acid, chromic acid, perchloric acid, nitric acid, sulfamic acid, sulfuric acid, fluorosulfuric acid, fluorophosphonic acid, tetrafluoroboric acid, hexafluorophosphoric acid, fluorosilicic acid, selenic acid, phosphoric acid, ammonium hydroxide, sodium hydroxide, or potassium hydroxide.

Embodiment 21

The fluid composition of any of embodiments 1-20, wherein the pH of the fluid composition is less than 4.

Embodiment 22

The fluid composition of any of embodiments 1-21, further comprising a chelating agent comprising phosphonate or etidronic acid.

Embodiment 23

The fluid composition of any of embodiments 1-22, further comprising a fluorosulfonate surfactant.

Embodiment 24

The fluid composition of any of embodiments 1-23, further comprising a rheology modifier comprising smectite, bentonite, or kaolinite.

Embodiment 25

The fluid composition of any of embodiments 1-24, wherein the fluid composition is substantially free of abrasive particles.

Embodiment 26

The fluid composition of any of embodiments 1-25, wherein the solvent is water.

Embodiment 27

A fluid composition for chemical-mechanical polishing, comprising: a solvent; a first oxidizing agent having an oxidation potential of 0.4 V or greater; a second oxidizing agent having a higher oxidation potential than the first oxidizing agent; and a multivalent cation component.

Embodiment 28

The fluid composition of embodiment 27, wherein the multivalent cation component comprises $Mn^{+2}$, $Cu^{+2}$, $Mg^{+2}$, $Ba^{+2}$, $Ag^{+2}$, $Ni^{+2}$, $Zn^{+2}$, $Al^{+3}$, $Fe^{+3}$, $Cr^{+3}$, $Co^{+3}$, $Ce^{+4}$, $Zr^{+4}$, or $Sn^{+4}$.

Embodiment 29

The fluid composition of any of embodiments 27-28, wherein the multivalent cation component is a salt, acid, or base.

Embodiment 30

The fluid composition of any of embodiments 27-29, wherein the multivalent cation component comprises an anionic component comprising a nitrate, tetrafluoroborate, fluorosulfate, hexafluorophosphate, fluorophosphonate, selenate, sulfate, phosphate, chloride, fluoride, or sulfamate.

Embodiment 31

The fluid composition of any of embodiments 27-30, wherein the multivalent cation component comprises aluminum nitrate.

Embodiment 32

The fluid composition of any of embodiments 27-31, wherein the amount of the multivalent cation component in the fluid composition is 0.01-15 wt %.

Embodiment 33

The fluid composition of any of embodiments 27-32, wherein the amount of the multivalent cation component in the fluid composition is 0.05-0.75 wt %.

Embodiment 34

The fluid composition of any of embodiments 27-33, wherein the multivalent cation component is a free acting ion or part of a complex.

Embodiment 35

The fluid composition of any of embodiments 27-34, wherein the first oxidizing agent comprises an ion, salt, acid, or base of permanganate, oxohalide of chlorine, bromine, or iodine, peroxide, persulfate, chromate, $Ce^{+4}$, and $Co^{+3}$.

Embodiment 36

The fluid composition of any of embodiments 27-35, wherein the first oxidizing agent comprises an ion, salt, acid, or base of permanganate or $Ce^{+4}$.

Embodiment 37

The fluid composition of any of embodiments 27-36, wherein the first oxidizing agent comprises sodium permanganate or potassium permanganate.

Embodiment 38

The fluid composition of any of embodiments 27-37, wherein the amount of the first oxidizing agent in the fluid composition is 0.1-20 wt %.

Embodiment 39

The fluid composition of any of embodiments 27-38, wherein the amount of the first oxidizing agent in the fluid composition is 0.5-5 wt %.

Embodiment 40

The fluid composition of any of embodiments 27-39, wherein the second oxidizing agent comprises an ion, salt, acid, or base of persulfate, ferrates, oxohalide of chlorine, bromine, or iodine, organoperoxide, chromate, $Ce^{+4}$, and $Co^{+3}$.

Embodiment 41

The fluid composition of any of embodiments 27-40, wherein the second oxidizing agent comprises sodium persulfate or potassium persulfate.

Embodiment 42

The fluid composition of any of embodiments 27-41, wherein an amount of the second oxidizing agent in the fluid composition is 0.01-20 wt %.

Embodiment 43

The fluid composition of any of embodiments 27-42, wherein an amount of the second oxidizing agent in the fluid composition is 0.1-0.5 wt %.

Embodiment 44

The fluid composition of any of embodiments 27-43, wherein the fluid composition has an oxidative normality of 0.2-2.

Embodiment 45

The fluid composition of any of embodiments 27-44, further comprising a pH modifier comprising hydrochloric acid, chromic acid, perchloric acid, nitric acid, sulfamic acid, sulfuric acid, fluorosulfuric acid, fluorophosphonic acid, tetrafluoroboric acid, hexafluorophosphoric acid, fluorosilicic acid, selenic acid, phosphoric acid, ammonium hydroxide, sodium hydroxide, or potassium hydroxide.

Embodiment 46

The fluid composition of any of embodiments 27-45, wherein the pH of the fluid composition is less than 4.

Embodiment 47

The fluid composition of any of embodiments 27-46, further comprising a chelating agent comprising phosphonate or etidronic acid.

Embodiment 48

The fluid composition of any of embodiments 27-47, further comprising a fluorosulfonate surfactant.

Embodiment 49

The fluid composition of any of embodiments 27-48, further comprising a rheology modifier comprising smectite, bentonite, or kaolinite.

Embodiment 50

The fluid composition of any of embodiments 27-49, wherein the fluid composition is substantially free of abrasive particles.

Embodiment 51

The fluid composition of any of embodiments 27-50, wherein the solvent is water.

Embodiment 52

A method of polishing an inorganic material, comprising: applying the fluid composition of any of embodiments 1-51 and 87-88 to a polishing pad; and polishing the inorganic material with the polishing pad.

Embodiment 53

The method of embodiment 52, wherein the inorganic material comprises silicon carbide, gallium nitride, gallium arsenide, aluminum nitride, indium phosphide, cadmium telluride, zinc telluride, zinc selenide, cadmium arsenide, bismuth telluride, or combinations thereof.

Embodiment 54

The method of embodiment 52, wherein the inorganic material is a single group 14 element of the periodic table or a single group 16 element of the periodic table.

Embodiment 55

The method of any of embodiments 52-54, wherein the polishing pad comprises textile, polyurethane, polyethylene, polyester, polyvinylchloride, polycarbonate, polyamide, polyacrylate, polystyrene, polypropylene, nylon, or combinations thereof.

Embodiment 56

The method of any of embodiments 52-55, wherein the polished inorganic material has an overall surface roughness of less than 5 Å.

Embodiment 57

The method of any of embodiments 52-56, wherein a material removal rate of the polishing is greater than 0.2 microns/hr.

Embodiment 58

A method of producing a fluid composition, comprising adding an oxidizing agent having an oxidation potential of 0.4 V or greater and a multivalent cation component to a solvent.

Embodiment 59

The method of embodiment 58, wherein the multivalent cation component comprises $Mn^{+2}$, $Cu^{+2}$, $Mg^{+2}$, $Ba^{+2}$, $Ag^{+2}$, Ni $Zn^{+2}$, $Al^{+3}$, $Fe^{+3}$, $Cr^{+3}$, $Co^{+3}$, $Ce^{+4}$, $Zr^{+4}$, or $Sn^{+4}$.

Embodiment 60

The method of any of embodiments 58-59, wherein the multivalent cation component is a salt, acid, or base.

Embodiment 61

The method of any of embodiments 58-60, wherein the multivalent cation component comprises an anionic component comprising a nitrate, tetrafluoroborate, fluorosulfate, hexafluorophosphate, fluorophosphonate, selenate, sulfate, phosphate, chloride, fluoride, or sulfamate.

Embodiment 62

The method of any of embodiments 58-61, wherein the multivalent cation component comprises aluminum nitrate.

Embodiment 63

The method of any of embodiments 58-62, wherein the amount of the multivalent cation component in the fluid composition is 0.01-15 wt %.

Embodiment 64

The method of any of embodiments 58-63, wherein the amount of the multivalent cation component in the fluid composition is 0.05-0.75 wt %.

Embodiment 65

The method of any of embodiments 58-64, wherein the multivalent cation component is a free acting ion or part of a complex.

Embodiment 66

The method of any of embodiments 58-65, wherein the oxidizing agent is an ion, salt, acid, or base of permanganate, oxohalide of chlorine, bromine, or iodine, peroxide, persulfate, chromate, $Ce^{+4}$, and $Co^{+3}$.

Embodiment 67

The method of any of embodiments 58-66, wherein the oxidizing agent comprises an ion, salt, acid, or base of permanganate or $Ce^{+4}$.

Embodiment 68

The method of any of embodiments 58-67, wherein the oxidizing agent comprises sodium permanganate or potassium permanganate.

Embodiment 69

The method of any of embodiments 58-68, wherein the amount of the oxidizing agent in the fluid composition is 0.1-20 wt %.

Embodiment 70

The method of any of embodiments 58-69, wherein the amount of the oxidizing agent in the fluid composition is 0.5-5 wt %.

Embodiment 71

The method of any of embodiments 58-70, further comprising adding a second oxidizing agent having a higher oxidation potential than the first oxidizing agent to the solvent.

Embodiment 72

The method of embodiment 71, wherein the second oxidizing agent comprises an ion, salt, acid, or base of persulfate, ferrates, oxohalide of chlorine, bromine, or iodine, organoperoxide, chromate, $Ce^{+4}$, and $Co^{+3}$.

Embodiment 73

The method of any of embodiments 71-72, wherein the second oxidizing agent comprises sodium persulfate or potassium persulfate.

Embodiment 74

The method of any of embodiments 71-73, wherein an amount of the second oxidizing agent in the fluid composition is 0.01-20 wt %.

Embodiment 75

The method of any of embodiments 71-74, wherein an amount of the second oxidizing agent in the fluid composition is 0.1-0.5 wt %.

Embodiment 76

The method of any of embodiments 58-75, wherein the fluid composition has an oxidative normality of 0.2-2.

Embodiment 77

The method of any of embodiments 58-76, further comprising adding further comprising adding a pH modifier comprising hydrochloric acid, chromic acid, perchloric acid, nitric acid, sulfamic acid, sulfuric acid, fluorosulfuric acid, fluorophosphonic acid, tetrafluoroboric acid, hexafluorophosphoric acid, fluorosilicic acid, selenic acid, phosphoric acid, ammonium hydroxide, sodium hydroxide, or potassium hydroxide.

Embodiment 78

The method of any of embodiments 58-77, wherein the pH of the fluid composition is less than 4.

Embodiment 79

The method of any of embodiments 58-78, further comprising adding chelating agent comprising phosphonate or etidronic acid to the solvent.

Embodiment 80

The method of any of embodiments 58-79, further comprising adding fluorosulfonate surfactant to the solvent.

Embodiment 81

The method of any of embodiments 58-80, further comprising adding rheology modifier comprising smectite, bentonite, or kaolinite to the solvent.

Embodiment 82

The method of any of embodiments 58-81, wherein the fluid composition is substantially free of abrasive particles.

Embodiment 83

The method of any of embodiments 58-82, wherein the solvent is water.

Embodiment 84

The method of any of embodiments 58-83, further comprising mixing the oxidizing agent and the multivalent cation component in the solution.

Embodiment 85

The method of any of embodiments 58-84, further comprising adding abrasive particles to the solvent.

Embodiment 86

A fluid composition produced from the method of any of embodiments 58-85.

Embodiment 87

The fluid composition of any of embodiments 1-26, further comprising abrasive particles.

Embodiment 88

The fluid composition of any of embodiments 27-51, further comprising abrasive particles.

This application discloses several numerical ranges in the text and figures. The numerical ranges disclosed inherently support any range or value within the disclosed numerical ranges, including the endpoints, even though a precise range limitation is not stated verbatim in the specification because this disclosure can be practiced throughout the disclosed numerical ranges.

The above description is presented to enable a person skilled in the art to make and use the disclosure, and is provided in the context of a particular application and its requirements. Various modifications to the preferred embodiments will be readily apparent to those skilled in the art, and the generic principles defined herein may be applied to other embodiments and applications without departing from the spirit and scope of the disclosure. Thus, this disclosure is not intended to be limited to the embodiments shown, but is to be accorded the widest scope consistent with the principles and features disclosed herein. Finally, the entire disclosure of the patents and publications referred in this application are hereby incorporated herein by reference.

The invention claimed is:

1. A fluid composition for chemical-mechanical polishing, comprising:
    a solvent;
    0.5-5 wt % of a first oxidizing agent comprising an ion, salt, acid, or base of permanganate or $Ce^{+4}$ and having an oxidation potential of 0.4 V or greater;
    0.1-0.5 wt % of a second oxidizing agent comprising an ion, salt, acid, or base of persulfate and having a higher oxidation potential than the first oxidizing agent and 0.05-0.75 wt % of a multivalent cation component comprising $Al^{+3}$, $Fe^{+3}$, or $Co^{+3}$.

2. The fluid composition of claim 1, wherein the multivalent cation component is a salt, acid, or base.

3. The fluid composition of claim 1, wherein the multivalent cation component comprises an anionic component comprising a nitrate, tetrafluoroborate, fluorosulfate, hexafluorophosphate, fluorophosphonate, selenate, sulfate, phosphate, chloride, fluoride, or sulfamate.

4. The fluid composition of claim 1, wherein the multivalent cation component comprises aluminum nitrate or iron nitrate.

5. The fluid composition of claim 1, wherein the multivalent cation component is a free acting ion or part of a complex.

6. The fluid composition of claim 1, wherein the oxidizing agent comprises sodium permanganate or potassium permanganate.

7. The fluid composition of claim 1, wherein the second oxidizing agent comprises sodium persulfate or potassium persulfate.

8. The fluid composition of claim 1, wherein the fluid composition is substantially free of abrasive particles.

9. The fluid composition of claim 1, wherein the solvent is water.

10. A method of polishing an inorganic material, comprising:
    applying the fluid composition of claim 1 to a polishing pad; and
    polishing the inorganic material with the polishing pad.

11. The method of claim 10, wherein the inorganic material comprises silicon carbide, gallium nitride, gallium arsenide, aluminum nitride, indium phosphide, cadmium telluride, zinc telluride, zinc selenide, cadmium arsenide, bismuth telluride, or combinations thereof.

12. The method of claim 10, wherein the inorganic material is a single group 14 element of the periodic table or a single group 16 element of the periodic table.

13. The method of claim 10, wherein the polishing pad comprises textile, polyurethane, polyethylene, polyester, polyvinylchloride, polycarbonate, polyamide, polyacrylate, polystyrene, polypropylene, nylon, or combinations thereof.

14. The method of claim 10, wherein the polished inorganic material has an overall surface roughness of less than 5 Å.

15. The method of claim 10, wherein a material removal rate of the polishing is greater than 0.2 microns/hr.

* * * * *